(12) United States Patent
Xu

(10) Patent No.: US 10,914,998 B2
(45) Date of Patent: Feb. 9, 2021

(54) ARRAY SUBSTRATE OF THIN-FILM TRANSISTOR LIQUID CRYSTAL DISPLAY DEVICE AND METHOD FOR MANUFACTURING THE SAME

(71) Applicant: Shenzhen China Star Optoelectronics Technology Co., Ltd., Guangdong (CN)

(72) Inventor: Xiangyang Xu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/739,271

(22) PCT Filed: Dec. 21, 2017

(86) PCT No.: PCT/CN2017/117734
§ 371 (c)(1),
(2) Date: Dec. 22, 2017

(87) PCT Pub. No.: WO2019/100502
PCT Pub. Date: May 31, 2019

(65) Prior Publication Data
US 2020/0285088 A1 Sep. 10, 2020

(30) Foreign Application Priority Data

Nov. 23, 2017 (CN) .......................... 2017 1 1188692

(51) Int. Cl.
*G02F 1/136* (2006.01)
*G02F 1/1368* (2006.01)
(Continued)

(52) U.S. Cl.
CPC ...... *G02F 1/1368* (2013.01); *G02F 1/136209* (2013.01); *G02F 1/136286* (2013.01);
(Continued)

(58) Field of Classification Search
CPC ..... G02F 2001/13625; G02F 1/136286; G02F 1/136209; G02F 2001/136222;
(Continued)

(56) References Cited

U.S. PATENT DOCUMENTS 6,573,195 B1 * 6/2003 Yamazaki ............. G02F 1/1362
438/783
8,368,625 B2 2/2013 Hsu et al.
(Continued)

FOREIGN PATENT DOCUMENTS

CN 101706633 A 5/2010
CN 102854680 A 1/2013
(Continued)

OTHER PUBLICATIONS

Office Action from Chinese patent office in a counterpart Chinese patent Application No. 201711188692.7 , dated Nov. 23, 2019 (6 pages).

*Primary Examiner* — Paisley L Wilson

(57) ABSTRACT

Disclosed are an array substrate of a thin-film transistor liquid crystal display device and a method for manufacturing the same. The array substrate includes a plurality of data lines, a plurality of dummy data lines, a plurality of first gate lines, a plurality of second gate lines, and a plurality of groups of pixel units. Each group of pixel units includes an odd-numbered column of first thin film transistors and an even-numbered column of second thin film transistors. First ends and second ends of the dummy data lines are connected respectively to two common voltage electrode lines, which are arranged on the substrate in a transverse direction. The
(Continued)

method includes steps of: forming a plurality of gate lines and two common voltage electrode lines; forming a source, a drain, and a plurality of data lines; and forming a plurality of pixel electrodes and a plurality of dummy data lines. A light shielding electrode line provided has good voltage driving uniformity.

11 Claims, 3 Drawing Sheets

(51) Int. Cl.
  *G02F 1/1362* (2006.01)
  *G09G 3/36* (2006.01)
  *H01L 21/02* (2006.01)
  *H01L 21/285* (2006.01)
  *H01L 27/12* (2006.01)

(52) U.S. Cl.
  CPC ..... *G09G 3/3659* (2013.01); *H01L 21/02274* (2013.01); *H01L 21/28506* (2013.01); *H01L 27/124* (2013.01); *H01L 27/1288* (2013.01); *H01L 27/1296* (2013.01); *G02F 2001/13625* (2013.01); *G02F 2001/136222* (2013.01); *G02F 2001/136295* (2013.01)

(58) Field of Classification Search
  CPC ............... H01L 27/124; H01L 27/1288; H01L 27/1296; G09G 3/3655; G09G 3/3659; G09G 2300/0413
  See application file for complete search history.

(56) References Cited

U.S. PATENT DOCUMENTS

2016/0231605 A1    8/2016  Yu et al.
2017/0068122 A1*   3/2017  Kim .................... G02F 1/13624

FOREIGN PATENT DOCUMENTS

| CN | 202837763 U | 3/2013 |
| CN | 103926757 A | 7/2014 |
| CN | 105372891 A | 3/2016 |
| KR | 20160072646 A | 6/2016 |

* cited by examiner

ARRAY SUBSTRATE OF THIN-FILM TRANSISTOR LIQUID CRYSTAL DISPLAY DEVICE AND METHOD FOR MANUFACTURING THE SAME

CROSS-REFERENCE TO RELATED APPLICATIONS

This application claims the priority of Chinese patent application CN 201711188692.7, entitled "Array substrate of thin-film transistor liquid crystal display device and method for manufacturing the same" and filed on Nov. 23, 2017, the entirety of which is incorporated herein by reference.

FIELD OF THE INVENTION

The present disclosure relates to the technical field of liquid crystal display, and in particular, to an array substrate of a thin-film transistor liquid crystal display device and a method for manufacturing the same.

BACKGROUND OF THE INVENTION

With the development of liquid crystal display technology, it has become common to manufacture three-dimensional and curved surface large-sized display devices. Meanwhile, with the development of high resolutions 4K (3840×2160) and 8K (7680×4320), it is required that a pixel size be smaller and smaller. The smaller a pixel size is, the lower an aperture ratio of a display panel is, and the narrower a data line 1 and a black matrix (BM) 2 light shielding layer are (as shown in FIG. 1).

However, when a curved surface is finished for the liquid crystal display panel, due to a shift between the BM 2 and the data line 1, the aperture ratio would be lower. When the shift is too large, light leakage would occur around a pixel, and contrast of the liquid crystal display panel would also be reduced. Therefore, in order to alleviate an effect of a shift between an upper substrate and a lower substrate of a liquid crystal display screen on display quality, as shown in FIG. 2, a designer would generally not provide black matrixes (used for blocking light) on the upper substrate at positions of orthographic projections of data lines 1, but providing light shielding electrode lines 5 right over the data lines 1 located on the lower substrate side. A relatively small voltage difference is kept between the light shielding electrode lines 5 on the lower substrate 4 and a common electrode 6 on the upper substrate 3, and a liquid crystal layer 7 is used for blocking light. Such technology is called data BM less (DBS) technology. The DBS technology enables liquid crystal molecules to remain an undeflected state, whereby light can be blocked. In the traditional DBS technology, array substrates of liquid crystal panels rely on a network of the light shielding electrode lines 5 (a 1D2G structure, as shown in FIG. 3) for conductivity. However, since the light shielding electrode lines 5 have large impedance, voltage driving uniformity of the light shielding electrode lines 5 is relatively poor.

SUMMARY OF THE INVENTION

In view of the above problem, an object of the present disclosure is to provide an array substrate of a thin-film transistor liquid crystal display device and a method for manufacturing the same, the array substrate and the method capable of realizing good voltage driving uniformity of a light shielding electrode line.

In order to achieve the above objective, the present disclosure provides an array substrate comprises a substrate. A plurality of data lines, a plurality of dummy data lines, a plurality of first gate lines, and a plurality of second gate lines are arranged on the substrate. The plurality of data lines and the plurality of dummy data lines are arranged in an alternate and spaced-apart manner in a longitudinal direction, and the plurality of first gate lines and the plurality of second gate lines are arranged in an alternate and spaced-apart manner in a transverse direction. A plurality of groups of pixel units are arranged surrounded by the plurality of data lines, the plurality of dummy data lines, the plurality of first gate lines, and the plurality of second gate lines. Each of the groups of pixel units comprises an odd-numbered column of first thin film transistors and an even-numbered column of second thin film transistors. Sources of two adjacent first thin film transistor and second thin film transistor in each group of pixel units are connected to a same data line. Gates of two adjacent first thin film transistor and second thin film transistor in each group of pixel units are connected to a first gate line and a second gate line, respectively. Drains of the first thin film transistors and drains of the second thin film transistors are each connected to a pixel electrode. First ends of the dummy data lines are connected to a common voltage electrode line, and second ends of the dummy data lines are connected to another common voltage electrode line. The common voltage electrode lines are arranged on the substrate in the transverse direction.

A light shielding electrode line is arranged on each of the data lines. A plurality of light shielding electrode lines and a plurality of pixel electrodes are arranged in an alternate and spaced-apart manner.

The first ends and the second ends of the dummy data lines are connected to the respective common voltage electrode lines by means of via holes.

Each column of first thin film transistors comprises a plurality of first thin film transistors which are arranged in a spaced-apart manner, and each column of second thin film transistors comprises a plurality of second thin film transistors which are arranged in a spaced-apart manner.

The present disclosure further provides a method for manufacturing an array substrate of a thin-film transistor liquid crystal display device. The method comprises steps of: 1), depositing a first metal layer on a substrate, and forming a plurality of first gate lines, a plurality of second gate lines, and two common voltage electrode lines on the substrate by photoetching; 2), depositing a gate insulation layer on a surface of the first metal layer, depositing a semiconductor active layer on a surface of the gate insulation layer, and then forming an ohmic contact layer on a surface of the semiconductor active layer; 3), depositing a second metal layer on a surface of a silicon island structure, and forming a source, a drain, and a plurality of data lines by photoetching; 4), forming a first insulation protection layer on a surface of the second metal layer; 5), manufacturing a red photoresist, a green photoresist, and a blue photoresist by lithography; 6), depositing a second insulation protection layer outside the semiconductor active layer, the source, and the drain, and forming via holes on the second insulation protection layer by photoetching; and 7), depositing a transparent conductive layer on a surface of the second insulation protection layer, and forming a plurality of pixel electrodes and a plurality of dummy data lines by photoetching, and connecting first ends and second ends of the dummy data lines respectively to the two common voltage electrode lines by means of the via holes.

In step 1), the first metal layer is formed on the substrate by physical vapor deposition. The first metal layer is made of aluminum, molybdenum, copper or an alloy, and has a thickness of 3000-6000 angstroms. The plurality of first gate lines, the plurality of second gate lines, and the two common voltage electrode lines are formed on the first metal layer by means of a mask after steps of exposing, developing, etching, and stripping.

In step 2), the gate insulation layer is formed on the surface of the first metal layer by plasma enhanced chemical vapor deposition. The gate insulation layer is a silicon nitride film or a silicon oxide film, and has a thickness of 2000-5000 angstroms. The silicon island structure is formed on the ohmic contact layer by means of a mask after steps of exposing, developing, dry etching, and stripping. The semiconductor active layer is an amorphous silicon layer, and has a thickness of 1500-3000 angstroms.

In step 3), the second metal layer is made of aluminum, molybdenum, copper or an alloy, and has a thickness of 3000-6000 angstroms. The source, the drain, and the plurality of data lines are formed on the second metal layer by means of a grey tone mask after steps of exposing, developing, metal etching for one time, dry etching for one time, etching for two times, dry etching for two times, and stripping.

In step 4), the first insulation protection layer is formed on the surface of the second metal layer by plasma enhanced chemical vapor deposition. The first insulation protection layer is a silicon nitride film or a silicon oxide film, and has a thickness of 500-2000 angstroms.

In step 6), the second insulation protection layer is formed outside the semiconductor active layer, the source, and the drain by plasma enhanced chemical vapor deposition. The second insulation protection layer is a silicon nitride film or a silicon oxide film, and has a thickness of 500-2000 angstroms. The via holes are formed on the second insulation protection layer by means of a mask after steps of exposing, developing, dry etching, and stripping. In step 7), the transparent conductive layer is formed on the surface of the second insulation protection layer by physical vapor deposition, and has a thickness of 400-1000 angstroms. The plurality of pixel electrodes and the plurality of dummy data lines are formed on the transparent conductive layer by means of a mask after steps of exposing, developing, etching, and stripping.

The present disclosure adopts the above technical solutions, and has advantages as follows. By providing a plurality of dummy data lines, and by connecting first ends and second ends of the dummy data lines respectively to two common voltage electrode lines, the present disclosure can help reduce impedance of each light shielding electrode line, thus realizing good voltage driving uniformity of light shielding electrode lines.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The present disclosure will be described hereinafter in detail based on the embodiments and with reference to the accompanying drawings. In the drawings.

DETAILED DESCRIPTION OF THE EMBODIMENTS

Figure 1:
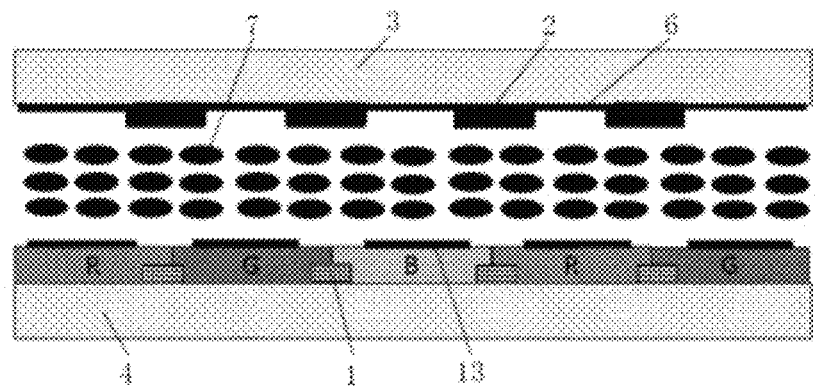
FIG. 1 schematically shows a structure in which a black matrix light shielding layer is provided according to the prior art.

The present disclosure will be explained in detail with reference to the accompanying drawings and the embodiments, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments can be combined together in any manner, and the technical solutions obtained in this manner all fall within the scope of the present disclosure. The terms such as "upper" and "lower" in the following text are directions relative to the directions shown in the drawings. Therefore, the terms indicating directions are used for explaining and understanding the present disclosure and should not be construed as limiting the scope thereof.

Figure 4:
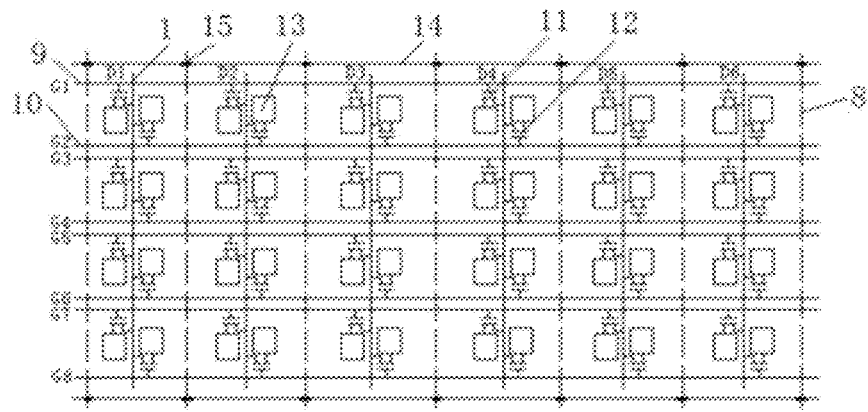
FIG. 4 schematically shows a structure of an array substrate of the present disclosure.

As shown in FIG. 4, according to the present disclosure, an array substrate of a thin film transistor liquid crystal display device comprises a plurality of data lines 1, a plurality of dummy data lines 8, a plurality of first gate lines 9, and a plurality of second gate lines 10, which are arranged on a substrate. The plurality of data lines 1 and the plurality of dummy data lines 8 are arranged in an alternate and spaced-apart manner in a longitudinal direction. The plurality of first gate lines 9 and the plurality of second gate lines 10 are arranged in an alternate and spaced-apart manner in a transverse direction. A plurality of groups of pixel units are arranged surrounded by the plurality of data lines 1, the plurality of dummy data lines 8, the plurality of first gate lines 9, and the plurality of second gate lines 10. Each group of pixel units comprises an odd-numbered column of first thin film transistors 11 and an even-numbered column of second thin film transistors 12. Sources of two adjacent first thin film transistor 11 and second thin film transistor 12 in each group of pixel units are connected to a same data line 1, so that a data signal can be input into the first thin film transistor 11 and the second thin film transistor 12 so as to drive a corresponding pixel unit for display. Gates of two adjacent first thin film transistor 11 and second thin film transistor 12 in each group of pixel units are connected to a first gate line 9 and a second gate line 10, respectively. Drains of first thin film transistors 11 and drains of second thin film transistors 12 each are connected to a pixel electrode 13, so that two adjacent first gate line 9 and second gate line 10 extending in parallel control pixels in a lower row and pixels in an upper row, respectively. First ends of the dummy data lines 8 are connected to a common voltage electrode line 14, and second ends of the dummy data lines 8 are connected to another common voltage electrode line 14. The common electrode lines 14 are arranged on the substrate in the transverse direction. In this way, impedance of light shielding electrode lines 5 (as shown in FIG. 2) can be reduced, and thus voltage driving stability thereof can be improved.

Figure 2:
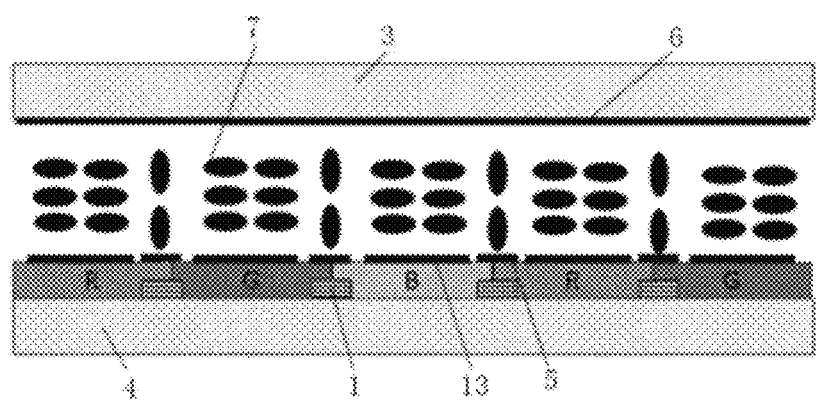
FIG. 2 schematically shows a structure of in which light shielding electrode lines are provided and a black matrix light shielding layer is not provided according to the prior art.
Figure 3:
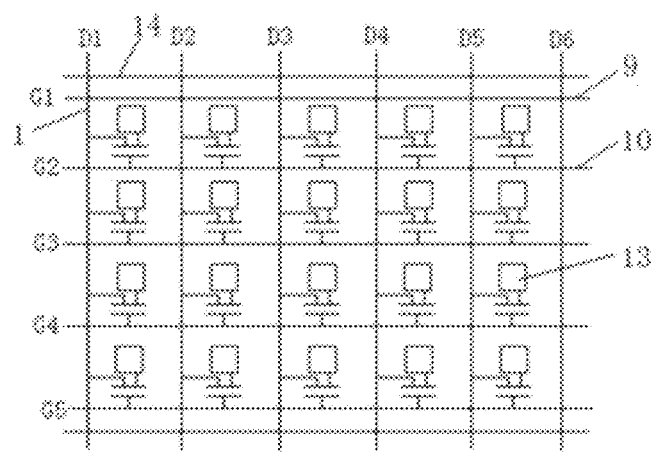
FIG. 3 schematically shows an array substrate of a liquid crystal panel in the prior art.

In the above embodiment, as shown in FIG. 2, a light shielding electrode line 5 is arranged above each data line 1. A plurality of light shielding electrode lines 5 and a plurality of pixel electrodes 13 are arranged in an alternate and spaced-apart manner.

In the above embodiment, the first ends and the second ends of the dummy data lines 8 are connected to the respective common voltage electrode lines 14 by means of via holes 15.

In the above embodiment, the common voltage electrode lines 14 are metal wires.

In the above embodiment, each odd-numbered column of first thin film transistors 11 comprises a plurality of first thin film transistors 11 which are arranged in a space-apart manner, and each even-numbered column of second thin film transistors comprises a plurality of second thin film transistors 12 which are arranged in a spaced-apart manner. In this way, a number of data lines can be decreased, so that a number of electrode contacts can be decreased. Besides, manufacturing time can be reduced, and image quality of the liquid crystal display device can be improved.

Figure 5:
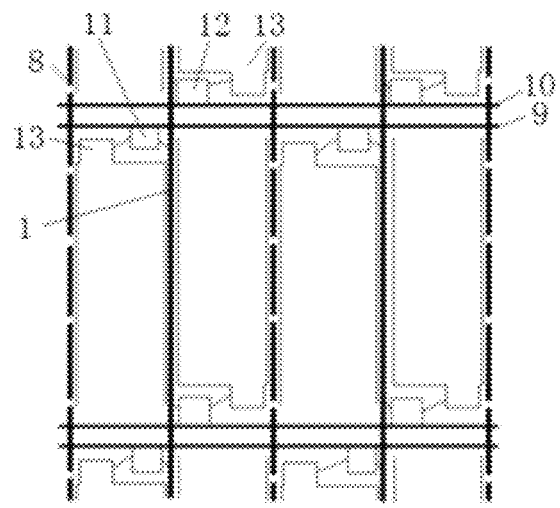
FIG. 5 schematically shows a structure of pixel electrodes and light shielding lines of the present disclosure.
Figure 6:
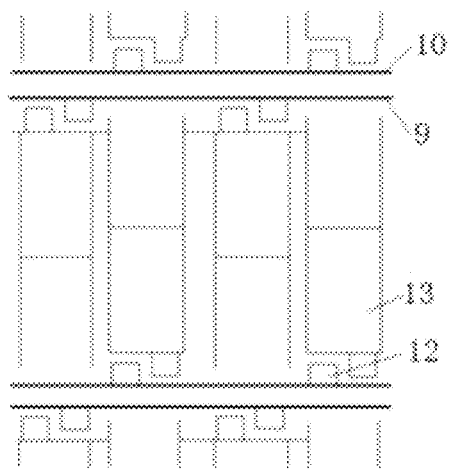
FIG. 6 schematically shows a structure of gate lines of the present disclosure.
Figure 7:
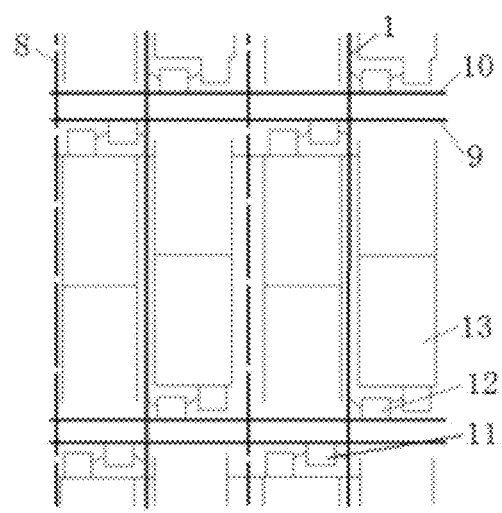
FIG. 7 schematically shows data lines and sources and drains of thin film transistors of the present disclosure.

As shown in FIGS. 5 to 7, according to the present disclosure, a method for manufacturing an array substrate of a thin-film transistor liquid crystal display device comprises steps as follows.

In step 1), a first metal layer is deposited on a substrate. A plurality of first gate lines 9, a plurality of second gate lines 10, and two common voltage electrode lines 14 are formed on the substrate by photoetching (as shown in FIG. 4).

In step 1), the first metal layer is formed on the substrate by physical vapor deposition (PVD). The first metal layer is made of aluminum, molybdenum, copper or an alloy, and has a thickness of 3000-6000 angstroms. The plurality of first gate lines 9, the plurality of second gate lines 10, and the two common voltage electrode lines 14 are formed on the first metal layer by means of a mask after steps of exposing, developing, etching, and stripping.

In step 2), a gate insulation layer is deposited on a surface of the first metal layer, and a semiconductor active layer is deposited on a surface of the gate insulation layer.

In order to reduce contact resistance between the first metal layer and the gate insulation layer, an N+ type layer (an ohmic contact layer) is subsequently formed on a corresponding portion of a surface of the semiconductor active layer by injecting ions. Then, a silicon island structure is formed by photoetching.

In step 2), the gate insulation layer is formed on the surface of the first metal layer by plasma enhanced chemical vapor deposition (PECVD). The gate insulation layer is a silicon nitride ($SiN_x$) film or a silicon oxide ($SiO_x$) film, and has a thickness of 2000-5000 angstroms. The silicon island structure is formed on the ohmic contact layer by means of a mask after steps of exposing, developing, dry etching, and stripping. The semiconductor active layer is an amorphous silicon (a-Si) layer, and has a thickness of 1500-3000 angstroms.

In step 3), a second metal layer is deposited on a surface of the silicon island structure. A source, a drain, and a plurality of data lines 1 are formed by photoetching.

In step 3), the second metal layer is made of aluminum, molybdenum, copper or an alloy, and has a thickness of 3000-6000 angstroms. The source, the drain, and the plurality of data lines 1 are formed on the second metal layer by means of a grey tone mask after steps of exposing, developing, metal etching for one time, dry etching for one time, etching for two times, dry etching for two times, and stripping.

In step 4), a first insulation protection layer is deposited on a surface of the second metal layer.

In step 4), the first insulation protection layer is formed on the surface of the second metal layer by PECVD. The first insulation protection layer is a silicon nitride ($SiN_x$) film or a silicon oxide ($SiO_x$) film, and has a thickness of 500-2000 angstroms.

In step 5), a red photoresist (R), a green photoresist (G), and a blue photoresist (B) are manufactured by lithography.

In step 5), the substrate is cleaned first, and a photoresist is uniformly coated on a surface of a conductive layer of the substrate. Next, the substrate is baked for a period of time at a certain temperature to volatilize a solvent of the photoresist, so that a solid photoresist layer is formed. Then, a surface of the photoresist is irradiated vertically with ultraviolet rays through a preset film to cause an irradiated portion of the photoresist to react. After that, the irradiated portion of the photoresist is removed from the surface of the substrate by using a weak KOH solution, and an unirradiated portion of the photoresist is reserved. After high temperature treatment, a portion of the conductive layer which is not covered by the photoresist is removed by using a proper acid solution so as to obtain an indium zinc oxide electrode pattern. At last, residual photoresist is removed by using a relatively strong KOH stripper solution, and after cleaning and drying the substrate, the R photoresist, the G photoresist, and the B photoresist are formed on the surface of the substrate.

In step 6), in order to protect the semiconductor active layer, the source, and the drain, a second insulation protection layer is formed outside the semiconductor active layer, the source, and the drain. Via holes 15 are formed on the second insulation protection layer by photoetching (as shown in FIG. 4).

In step 6), the second insulation protection layer is formed outside the semiconductor active layer, the source, and the drain by PECVD. The second insulation protection layer is a silicon nitride ($SiN_x$) film or a silicon oxide ($SiO_x$) film, and has a thickness of 500-2000 angstroms. The via holes 15 are formed on the second insulation protection layer by means of a mask after steps of exposing, developing, dry etching, and stripping.

In step 7), a transparent conductive layer is deposited on a surface of the second insulation protection layer, and a plurality of pixel electrodes 13 and a plurality of dummy data lines 8 are formed by photoetching. Moreover, first ends and second ends of the dummy data lines 8 are respectively connected to the two common voltage electrode lines 14 by means of the via holes 15.

In step 7), the transparent conductive layer is formed on the surface of the second insulation protection layer by PVD, and has a thickness of 400-1000 angstroms. The plurality of pixel electrodes 13 and the plurality of dummy data lines 8 are formed on the transparent conductive layer by means of a mask after steps of exposing, developing, etching, and stripping.

The above embodiments are described only for better understanding, rather than restricting the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for processing an array substrate of a thin-film transistor liquid crystal display device, wherein the method comprises steps as follows:
   step 1), depositing a first metal layer on a substrate, and forming a plurality of first gate lines, a plurality of second gate lines, and two common voltage electrode lines on the substrate by photoetching;
   step 2), depositing a gate insulation layer on a surface of the first metal layer, depositing a semiconductor active layer on a surface of the gate insulation layer, and then forming an ohmic contact layer on a surface of the semiconductor active layer, and forming a silicon island structure on the ohmic contact layer;
   step 3), depositing a second metal layer on a surface of the silicon island structure, and forming a source, a drain, and a plurality of data lines by photoetching the second metal layer;
   step 4), forming a first insulation protection layer on a surface of the second metal layer;
   step 5), processing a red photoresist, a green photoresist, and a blue photoresist by lithography;
   step 6), depositing a second insulation protection layer outside the semiconductor active layer, the source, and the drain, and forming via holes on the second insulation protection layer by photoetching; and
   step 7), depositing a transparent conductive layer on a surface of the second insulation protection layer which is formed outside the semiconductor active layer, the source, and the drain, and forming a plurality of pixel electrodes and a plurality of dummy data lines by photoetching the transparent conductive layer, and connecting first ends and second ends of the dummy data lines respectively to the two common voltage electrode lines by means of the via holes.

2. The method according to claim 1, wherein in step 1), the first metal layer is formed on the substrate by physical vapor deposition,
   wherein the first metal layer is made of aluminum, molybdenum, copper or an alloy, and has a thickness of 3000-6000 angstroms, and
   wherein the plurality of first gate lines, the plurality of second gate lines, and the two common voltage electrode lines are formed on the first metal layer by means of a mask after steps of exposing, developing, etching, and stripping.

3. The method according to claim 1, wherein in step 2), the gate insulation layer is formed on the surface of the first metal layer by plasma enhanced chemical vapor deposition;
   the gate insulation layer is a silicon nitride film or a silicon oxide film, and has a thickness of 2000-5000 angstroms;
   the silicon island structure is formed on the ohmic contact layer by means of a mask after steps of exposing, developing, dry etching, and stripping; and
   the semiconductor active layer is an amorphous silicon layer, and has a thickness of 1500-3000 angstroms.

4. The method according to claim 1, wherein in step 3), the second metal layer is made of aluminum, molybdenum, copper or an alloy, and has a thickness of 3000-6000 angstroms, and
   the source, the drain, and the plurality of data lines are formed on the second metal layer by means of a grey tone mask after steps of exposing, developing, metal etching for one time, dry etching for one time, etching for two times, dry etching for two times, and stripping.

5. The method according to claim 1, wherein in step 4), wherein the first insulation protection layer is formed on the surface of the second metal layer by plasma enhanced chemical vapor deposition, wherein the first insulation protection layer is a silicon nitride film or a silicon oxide film, and has a thickness of 500-2000 angstroms.

6. The method according to claim 1,
   wherein in step 6), the second insulation protection layer is formed outside the semiconductor active layer, the source, and the drain by plasma enhanced chemical vapor deposition,
   wherein the second insulation protection layer is a silicon nitride film or a silicon oxide film, and has a thickness of 500-2000 angstroms, and wherein the via holes are formed on the second insulation protection layer by means of a mask after steps of exposing, developing, dry etching, and stripping, and
   wherein in step 7), the transparent conductive layer is formed on the surface of the second insulation protection layer by physical vapor deposition, and has a thickness of 400-1000 angstroms, wherein the plurality of pixel electrodes and the plurality of dummy data lines are formed on the transparent conductive layer by means of a mask after steps of exposing, developing, etching, and stripping.

7. The method according to claim 1, wherein in step 2), the ohmic contact layer is an N+ type layer formed on a corresponding portion of a surface of the semiconductor active layer by injecting ions.

8. The method according to claim 1,
   wherein in step 5), processing a red photoresist, a green photoresist, and a blue photoresist by lithography comprises:
   cleaning the substrate first;
   coating a photoresist on a surface of a conductive layer of the substrate uniformly;
   baking the substrate for a period of time at a preset temperature to volatilize a solvent of the photoresist to form a solid photoresist layer;
   irradiating a surface of the photoresist vertically with ultraviolet rays through a preset film to cause an irradiated portion of the photoresist to react;
   removing the irradiated portion of the photoresist from a surface of the substrate by using a first KOH solution, and reserving an unirradiated portion of the photoresist;
   removing a portion of the conductive layer which is not covered by the photoresist by using an acid resolution after heating;
   obtaining an indium zinc oxide electrode pattern;
   removing the residual photoresist by using a second KOH stripper solution; wherein the second KOH solution has a PH value greater than the first KOH solution; and
   forming the red photoresist, the green photoresist, and the blue photoresist after cleaning and drying the substrate.

9. The method according to claim 1,
   wherein the plurality of data lines and the plurality of dummy data lines are arranged in an alternate and spaced-apart manner in a longitudinal direction, and the plurality of first gate lines and the plurality of second gate lines are arranged in an alternate and spaced-apart manner in a transverse direction, wherein a plurality of groups of pixel units are arranged surrounded by the plurality of data lines, the plurality of dummy data lines, the plurality of first gate lines, and the plurality of second gate lines, wherein each of the groups of pixel units comprises an odd-numbered column of first thin film transistors and an even-numbered column of second thin film transistors, wherein sources of two adjacent first thin film transistor and second thin film transistor in each group of pixel units are connected to a same data line, wherein gates of the two adjacent first thin film transistor and second thin film transistor in each group of pixel units are connected to a first gate line and a second gate line, respectively, and wherein drains of the first thin film transistors and drains of the second thin film transistors are each connected to a pixel electrode, and wherein first ends of the dummy data lines are connected to a common voltage electrode line, and second ends of the dummy data lines are connected to another common voltage electrode line, wherein the common voltage electrode lines are arranged on the substrate in the transverse direction.

10. The method according to claim 9, wherein each column of first thin film transistors comprises a plurality of first thin film transistors which are arranged in a spaced-apart manner, and each column of second thin film transistors comprises a plurality of second thin film transistors which are arranged in a spaced-apart manner.

11. The method according to claim 1, wherein a light shielding electrode line is arranged on each of the data lines, wherein a plurality of light shielding electrode lines and a plurality of pixel electrodes are arranged in an alternate and spaced-apart manner.

* * * * *